United States Patent
Liang et al.

(10) Patent No.: US 10,586,847 B2
(45) Date of Patent: Mar. 10, 2020

(54) MULTILAYER DEVICE

(71) Applicant: Hewlett Packard Enterprise Development LP, Houston, TX (US)

(72) Inventors: Di Liang, Santa Barbara, CA (US); Xue Huang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/065,782

(22) PCT Filed: Jan. 15, 2016

(86) PCT No.: PCT/US2016/013605
§ 371 (c)(1),
(2) Date: Jun. 22, 2018

(87) PCT Pub. No.: WO2017/123245
PCT Pub. Date: Jul. 20, 2017

(65) Prior Publication Data
US 2019/0019863 A1    Jan. 17, 2019

(51) Int. Cl.
*H01L 29/06* (2006.01)
*H01L 21/762* (2006.01)
(Continued)

(52) U.S. Cl.
CPC ...... *H01L 29/0649* (2013.01); *H01L 21/2007* (2013.01); *H01L 21/306* (2013.01);
(Continued)

(58) Field of Classification Search
CPC ... H01L 29/0649; H01L 29/20; H01L 21/306; H01L 21/2007; H01L 21/76251; H01L 27/07
See application file for complete search history.

(56) References Cited

U.S. PATENT DOCUMENTS 5,294,808 A    3/1994  Lo
5,512,375 A    4/1996  Green et al.
(Continued)

FOREIGN PATENT DOCUMENTS

CN    102314057 B    5/2014
EP     2146243 A1    1/2010
(Continued)

OTHER PUBLICATIONS

Office Action, dated Apr. 14, 2017, U.S. Appl. No. 15/328,903, 26 pages.
(Continued)

*Primary Examiner* — Peniel M Gumedzoe
(74) *Attorney, Agent, or Firm* — McDermott Will & Emery, LC (57) ABSTRACT

A multilayer device includes a substrate having a trench extending along a first surface of the substrate. A first layer disposed on the first surface of the substrate, the first layer comprising a given surface and another surface. A dielectric layer is formed between the given surface of the first layer and the first surface of the substrate. An active region disposed on the other surface of the first layer overlying the trench, wherein at least a portion of the active region resides substantially above a region defined by the trench.

20 Claims, 5 Drawing Sheets

(51) Int. Cl.
  *H01L 21/20* (2006.01)
  *H01L 21/306* (2006.01)
  *H01L 27/07* (2006.01)
  *H01L 29/786* (2006.01)
  *H01L 29/66* (2006.01)
  *H01L 29/20* (2006.01)

(52) U.S. Cl.
  CPC ...... *H01L 21/762* (2013.01); *H01L 21/76251* (2013.01); *H01L 27/07* (2013.01); *H01L 29/66742* (2013.01); *H01L 29/78603* (2013.01); *H01L 29/78642* (2013.01); *H01L 29/78681* (2013.01); *H01L 29/20* (2013.01)

(56) References Cited

U.S. PATENT DOCUMENTS

| | | | |
|---|---|---|---|
| 5,883,009 | A | 3/1999 | Villa et al. |
| 5,981,400 | A | 11/1999 | Lo |
| 6,475,873 | B1 | 11/2002 | Kalnitsky et al. |
| 6,492,283 | B2 | 12/2002 | Raaijmakers |
| 6,493,476 | B2 | 12/2002 | Bendett |
| 6,585,424 | B2 | 7/2003 | Chason |
| 6,705,681 | B2 | 3/2004 | Russ |
| 6,706,581 | B1 | 4/2004 | Hou et al. |
| 6,902,987 | B1 | 6/2005 | Tong et al. |
| 7,087,452 | B2 | 8/2006 | Joshi et al. |
| 7,231,123 | B2 | 6/2007 | Sugita et al. |
| 7,368,816 | B2 | 5/2008 | Lim et al. |
| 7,560,361 | B2 | 7/2009 | Frank et al. |
| 7,579,263 | B2 | 8/2009 | Han et al. |
| 7,817,881 | B2 | 10/2010 | Li |
| 7,838,314 | B2 | 11/2010 | Choi |
| 7,935,559 | B1* | 5/2011 | Giffard ............. H01L 27/14683 257/E21.189 |
| 7,949,210 | B2 | 5/2011 | Durfee et al. |
| 8,078,018 | B2 | 12/2011 | Mouli |
| 8,106,468 | B2 | 1/2012 | Wang et al. |
| 8,344,453 | B2 | 1/2013 | Muller |
| 8,372,673 | B2 | 2/2013 | Lee et al. |
| 8,502,279 | B2 | 8/2013 | Toh et al. |
| 8,664,087 | B2 | 3/2014 | Chang et al. |
| 8,716,852 | B2 | 5/2014 | Shu et al. |
| 9,018,675 | B2 | 4/2015 | Bedell et al. |
| 9,059,252 | B1 | 6/2015 | Liu |
| 9,240,406 | B2 | 1/2016 | Feng |
| 9,269,724 | B2 | 2/2016 | Han et al. |
| 9,509,122 | B1 | 11/2016 | Norberg et al. |
| 9,570,351 | B2 | 2/2017 | Liang |
| 9,640,531 | B1 | 5/2017 | Or-Bach |
| 9,773,906 | B2 | 9/2017 | Wang et al. |
| 2002/0081793 | A1 | 6/2002 | Yang et al. |
| 2002/0094661 | A1 | 7/2002 | Enquist et al. |
| 2002/0121337 | A1* | 9/2002 | Whatmore ............. H03H 9/105 156/285 |
| 2002/0168837 | A1 | 11/2002 | Hsu et al. |
| 2003/0134446 | A1 | 7/2003 | Koike et al. |
| 2003/0203550 | A1 | 10/2003 | Lai et al. |
| 2004/0028092 | A1 | 2/2004 | Kim |
| 2004/0081386 | A1 | 4/2004 | Morse |
| 2004/0152272 | A1 | 8/2004 | Fladre |
| 2004/0184502 | A1 | 9/2004 | Miyachi et al. |
| 2004/0248334 | A1 | 12/2004 | Hoss et al. |
| 2004/0257171 | A1 | 12/2004 | Park et al. |
| 2005/0081958 | A1* | 4/2005 | Adachi ............. H01L 21/76251 148/33.1 |
| 2005/0106790 | A1 | 5/2005 | Cheng et al. |
| 2005/0139857 | A1 | 6/2005 | Shin |
| 2006/0035450 | A1 | 2/2006 | Frank et al. |
| 2006/0181542 | A1 | 8/2006 | Granger |
| 2007/0275505 | A1 | 11/2007 | Wolterink et al. |
| 2008/0012145 | A1 | 1/2008 | Jang |
| 2008/0018983 | A1 | 1/2008 | Ishii et al. |
| 2008/0175294 | A1 | 7/2008 | Kim et al. |
| 2008/0283877 | A1 | 11/2008 | Collonge et al. |
| 2009/0101997 | A1 | 4/2009 | Lammel et al. |
| 2009/0194152 | A1 | 8/2009 | Liu et al. |
| 2009/0200636 | A1 | 8/2009 | Edelstein |
| 2009/0242935 | A1 | 10/2009 | Fitzgerald |
| 2009/0263076 | A1 | 10/2009 | Mathai |
| 2009/0302415 | A1 | 12/2009 | Mueller |
| 2010/0119231 | A1 | 5/2010 | Kim et al. |
| 2010/0140629 | A1 | 6/2010 | Lee et al. |
| 2010/0140739 | A1 | 6/2010 | Kim |
| 2010/0215309 | A1 | 8/2010 | Shubin et al. |
| 2011/0045644 | A1 | 2/2011 | Barth et al. |
| 2011/0073989 | A1 | 3/2011 | Rong et al. |
| 2011/0188112 | A1 | 8/2011 | Stievater et al. |
| 2011/0293216 | A1 | 12/2011 | Lipson et al. |
| 2012/0002285 | A1 | 1/2012 | Matsuda |
| 2012/0008658 | A1 | 1/2012 | Chung |
| 2012/0091463 | A1 | 4/2012 | Yokogawa et al. |
| 2012/0119258 | A1 | 5/2012 | Liang |
| 2013/0009182 | A1 | 1/2013 | Jung et al. |
| 2013/0009321 | A1 | 1/2013 | Kagawa |
| 2013/0029449 | A1 | 1/2013 | Cheng et al. |
| 2013/0049203 | A1 | 2/2013 | Ahrens et al. |
| 2013/0063226 | A1 | 3/2013 | Burak et al. |
| 2013/0137202 | A1 | 5/2013 | Assefa et al. |
| 2013/0147021 | A1 | 6/2013 | Puurunen et al. |
| 2013/0155484 | A1 | 6/2013 | Sweatlock |
| 2013/0168776 | A1 | 7/2013 | Liang et al. |
| 2014/0141546 | A1 | 5/2014 | Cho |
| 2014/0264723 | A1 | 9/2014 | Liang et al. |
| 2014/0307997 | A1 | 10/2014 | Bar et al. |
| 2015/0055910 | A1 | 2/2015 | Liang |
| 2015/0069418 | A1 | 3/2015 | Heo et al. |
| 2015/0140720 | A1 | 5/2015 | Collins |
| 2015/0144928 | A1 | 5/2015 | Forrest et al. |
| 2015/0177458 | A1* | 6/2015 | Bowers .................. G02B 6/131 385/14 |
| 2015/0179447 | A1 | 6/2015 | Ryou |
| 2015/0212266 | A1 | 7/2015 | Czornomaz et al. |
| 2016/0094014 | A1 | 3/2016 | Shin et al. |
| 2016/0126381 | A1 | 5/2016 | Wang et al. |
| 2016/0202504 | A1 | 7/2016 | Kim et al. |
| 2016/0238860 | A1 | 8/2016 | Liang et al. |
| 2017/0077325 | A1 | 3/2017 | Norberg et al. |
| 2017/0139132 | A1 | 5/2017 | Patel et al. |
| 2017/0146740 | A1 | 5/2017 | Orcutt et al. |
| 2017/0358607 | A1 | 12/2017 | Balakrishnan et al. |

FOREIGN PATENT DOCUMENTS

| | | |
|---|---|---|
| WO | WO-2013066318 A1 | 5/2013 |
| WO | WO-2013165376 A1 | 11/2013 |
| WO | WO-2014021781 A1 | 2/2014 |
| WO | 2014/209398 A1 | 12/2014 |
| WO | WO-2016018285 A1 | 2/2016 |
| WO | WO-2016122547 | 8/2016 |
| WO | 2017/123245 A1 | 7/2017 |

OTHER PUBLICATIONS

Office Action, dated Nov. 8, 2016, U.S. Appl. No. 15/141,948, 20 pages.
Chen, X., et al.; "Active Transmission Control Based on Photonic-Crystal MOS Capacitor"; Jan. 23, 2007; pp. 1-9.
Fan, Y-Y., et al; "Impact of Interfacial Layer and Transition Region on Gate Current Performance for High-K Gate Dielectric Stack: Its Tradeoff With Gate Capacitance,"; Feb. 2003; pp. 433-439.
Heck, M. J. R., et al.; "Hybrid Silicon Photonics for Optical Interconnects"; Aug. 13, 2010; pp. 1-14.
Jeong, Y-K. et al.; "High Quality High-k MIM Capacitor by Ta2O5/HfO2/Ta2O5 Multi-layered Dielectric and NH3 Plasma Interface Treatments for Mixed-Signal/RF Applications,"; Jun. 15-17, 2004; pp. 222-223.
Kissinger et al., "Void-free silicon-wafer-bond strengthening in the 200-400° C. range", Sens. Actuators. A 36, 1993, pp. 149-156.
Li. J.; "Wafer Scale Flexible Interconnect Fabrication for Heterogeneous Integration"; Oct. 26, 2015; 94 pages.

(56) References Cited

OTHER PUBLICATIONS

Liang et al, "Highly efficient vertical outgassing channels for low-temperature InP-to-silicon direct wafer bonding on the silicon-on-insulator substrate"; 2008; pp. 1560-1568.

Liu, A.; et al., "A High-Speed Silicon Optical Modulator Based on a Metal—Oxide—Semiconductor Capacitor," Nature 427, Feb. 12, 2004, Nature Publishing Group, pp. 615-618.

PCT; "International Search Report"; issued in Appl. No. PCTUS2014/048818; dated Apr. 22, 2015; 13 pages.

Zhiping Zhou et al. "On-chip light sources for silicon photonics" Light: Science & Applications, www.natrure.com/lsa Aug. 5, 2015, pp. 1-13.

Yu Xia, "Tetracene air-gap single-crystal field-effect transistors." Applied Physics Letters 90, 162106, 2007, 3 pages, <http://rogers.matse.illinois.edu/files/2007/tetraceneapl.pdf>.

Youngho Jung et al. "Hybrid integration of III-V semiconductor lasers on silicon waveguides using optofluidic microbubble manipulation" Scientific Reports www.nature.com/scientificreports, published Jul. 19, 2016, pp. 1-7.

Xiaonan Chen et al., "Active Transmission Control Based on Photonic-Crystal MOS Capacitor," Photonic Crystal Materials and Devices VI, Jan. 23, 2007, Proc. of SPIE vol. 6480 pp. 1-9.

Xianshu Luo et al. "High-throughput multiple dies-to-wafer bonding technology and III/V-on-Si hybrid laser for heterogeneous integration of optoelectronic integrated circuits" www.Frontiersin.org published Apr. 7, 2015, pp. 1-22.

Masahiro Yanagisawa et al. "Film-Level hybrid integration of AlGaAs laser diode with glass waveguide on Si substrate" IEEEPhotonics Technology Letters, vol. 4, No. 1, Jan. 1992, pp. 21-23.

Liang, D., "III-V-on-Silicon Hybrid Integration, Materials, Devices, and Applications," IEEE Winter Topicals, 2011, pp. 151-152.

International Search Report and Written Opinion received for PCT Patent Application No. PCT/US2015/048365, dated May 30, 2016, 11 pages.

International Search Report and Written Opinion received for PCT Patent Application No. PCT/US2014/048833, dated Apr. 29, 2015, 9 pages.

International Search Report and Written Opinion received for PCT Patent Application No. PCT/US16/24823, dated Dec. 26, 2016, 10 pages.

International Search Report and Written Opinion received for PCT Application No. PCT/US2016/013605, dated Oct. 13, 2016, 10 pages.

International Preliminary Report on Patentability received for PCT Patent Application No. PCT/US2015/048365, dated Mar. 15, 2018, 10 pages.

International Preliminary Report on Patentability received for PCT Patent Application No. PCT/US2014/048833, dated Feb. 9, 2017, 7 pages.

International Preliminary Report on Patentability received for PCT Patent Application No. PCT/US2014/048818, dated Feb. 9, 2017, 10 pages.

International Preliminary Report on Patentability received for PCT Patent Application No. PCT/US16/24823, dated Oct. 11, 2018, 9 pages.

International Preliminary Report on Patentability received for PCT Application No. PCT/US2016/013605, dated Jul. 26, 2018, 9 pages.

Hirakawa. K. et al., High Resolution Subpixel and Subframe Rendering for Color Flatpanel and Projector Displays, 2011 18th IEEE International Conference, Sep. 11-14, 2011, pp. 1725-1728.

Haataja, M. et al.; "Dislocations and Morphological Instabilities: Continuum Modeling of Misfitting Heteroepitaxial Films"; Apr. 5, 2002; 20 pages.

Gosh, S., et al; "Investigations on Thermal Stress Relief Mechanism Using Air-gapped Sio2 Nanotemplates During Epitaxial Growth of Ge on Si and Corresponding Hole Mobility Improvement"; Apr. 20-12; 4 pages.

Gosh, S., et al; "Experimental and Theoretical Investigation of Thermal Stress Relief During Epitaxial Growth of Ge on Si Using Air-gapped Sio2 Nanotemplates"; Oct. 2011; 9 pages.

Google search (hybrid laser, waveguide, substrate) pp. 1-2.

Caglar Duman etl al. "Comparative modeling results for ridge waveguide MQW and hybrid Si/III-V lasers" Journal of radiation research and applied sciences, Nov. 17, 2017, pp. 1-5.

Alexander W. Fang "Electrically pumped hybrid AlGalnAs-silicon evanescent laser" Optical Society of America, Oct. 2, 2016/ vol. 14, No. 20/Optics Express, pp. 9203-9210.

Impact of Interfacial Layer and Transition Region on Gate Current Performance for High-K Gate Dielectric Stack: Its Trade off With Gate Capacitance, (Research Paper), Electron Devices, IEEE Transacfons on 50.2, Feb. 2003, pp. 433-439.

Kuldeep Amarnath, "Active Microring and Microdisk Optical Resonators on Indium Phosphide," Dissertation, 2006, pp. 1-163.

Liang D et al: "Optimization of Hybrid Silicon Microring Lasers", IEEE Photonics Journal, IEEE, USA, vol. 3, No. 3, Jun. 28, 2011 (Jun. 28, 2011), pp. 580-587.

Sysak et al., "Hybrid Silicon Laser Technology: A Thermal Perspective," Selected Topics in Quantum Electronics, IEEE Journal of 17.6, 2011, pp. 1490-1498.

Y. Tang et al., "50 Gb/s hybrid silicon traveling-wave electroabsorption modulator", Optics Express, Mar. 28, 2011, vol. 19, No. 7, pp. 5811-5816.

International Search Report and Written Opinion received for PCT Patent Application No. PCT/US19/29478, dated Aug. 27, 2019, 13 pages.

* cited by examiner

MULTILAYER DEVICE

BACKGROUND

Heteroepitaxy is epitaxy performed with materials that have different physical properties. Silicon (Si) has become a widely used semiconductor, in particular for microelectronic systems. As Si does not emit photons efficiently, heteroepitaxial growth of optical gain materials, e.g., III-V compound semiconductors, directly on a Si substrate has been a goal for both industry and academia. However, heteroepitaxial growth of III-V compound semiconductors on Si can result in a number of detrimental defects, such as threading dislocations, due to lattice and/or thermal mismatch. The dislocations originate at the III-V/Si growth interface and can propagate into the optical gain material toward the active region, tending to reduce the life and performance of the system.

DETAILED DESCRIPTION

This disclosure relates to a hybrid multilayer device and methods to fabricate a hybrid multilayer device, to enable high-quality heteroepitaxy. As an example, the device can include a substrate and a first layer disposed on the substrate. The device includes a layer of dielectric material between the first layer and the substrate. A trench can extend through (e.g., partially or completely) the substrate. The trench has respective sidewalls spaced apart from each other that extend between opposing surfaces, which surfaces correspond to layers of the substrate and the dielectric layer that separates the substrate from the first layer. For example, the trench is dimensioned and configured such that the distance between the sidewalls (e.g., its width) is greater than a distance (e.g., its height) between the surfaces between which the sidewalls extend. An optically active region resides (e.g., is formed or otherwise attached) on the first layer overlying the trench, such that at least a portion of the optically active structure is located in overlying relationship within a boundary defined by the sidewalls of the trench.

The presence of the dielectric layer between the substrate and the first layer encapsulate surfaces that would otherwise be exposed (e.g., one or more surfaces of the first layer and/or the substrate). In some examples a wafer bonding process can be used to affix a template, corresponding to the first layer and the dielectric, onto the substrate with a shallow trench. In one example, encapsulation of the first layer as provided by the dielectric layer mitigates damage that may occur to the first layer due to elevated temperatures required for the wafer bonding process. The elevated temperatures (e.g., 600 degrees Celsius) can increase the temperature of any gases present in the trench to a level sufficient to cause damage to one or more materials used to form the device. In this example, the first layer can comprise Indium phosphide (InP) that can crack and/or decompose when exposed to such high temperatures. In another example, one or more surfaces of the substrate are also encapsulated with a dielectric. Thus, the hybrid multilayer device described herein mitigates the effects on the materials by encapsulating exposed surfaces with a dielectric layer. The presence of one or more dielectric layers serves to protect the device from extreme temperatures, as well as to provide protection from exposure to potentially damaging processing steps and substances.

As used herein, heteroepitaxy (e.g., monolithic integration) refers to a technique to integrate different materials in layers for specific functions and enhanced device performance. In heteroepitaxy, a crystalline film is applied to a crystalline substrate or film of a different material. This technology is often used to fabricate integrated crystalline layers of different materials, for example, in fabrication of a multilayer integrated circuit.

Figure 1:
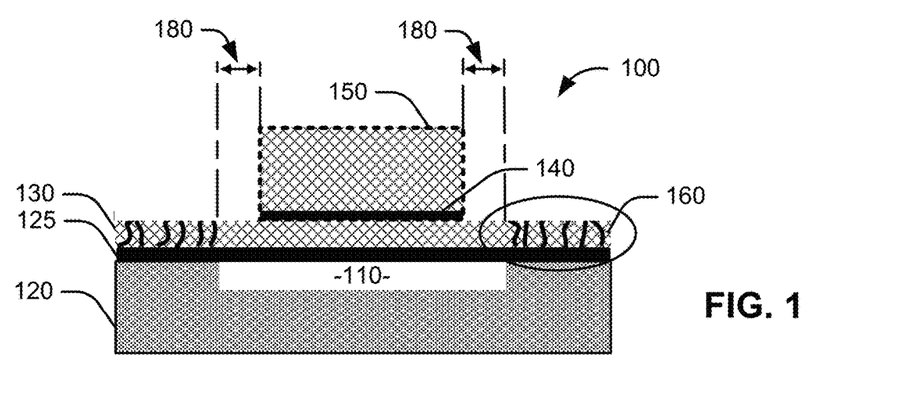
FIG. 1 illustrates an example of a hybrid multilayer device.

FIG. 1 illustrates a hybrid multilayer device 100 that can substantially eliminate defects associated with lattice and/or thermal mismatch in an area on the layered device corresponding to, for example, an active region. Additionally, one or more layers of a dielectric material are employed to encapsulate one or more surfaces to protect the materials against exposure to the processing environment. In the example of FIG. 1, substrate 120 is provided with a trench 110 formed by, for example, lithography and etching. Depending on the desired application, the trench 110 can be straight, curved, or another useful shape. The trench can be formed in the substrate 120 and/or in an adjacent layer that is fixed to the substrate. The substrate 120 can be made from, for example, Si, sapphire, germanium, gallium compounds or other suitable materials. A first layer 130 is disposed above the substrate 120, such that substrate 120 and first layer 130 make contact on both sides of the trench 110 yet no contact is made between layers surrounding the trench 110. The layer 130 can be a III-V compound semiconductor. In order to prevent damage being caused by outgassing or potential material growth inside the exposed areas during manufacturing, an additional dielectric layer 125 (e.g., $SiO_2$, $Si_3N_4$, $Al_2O_3$, etc.) can be formed on the template and/or the substrate prior to bonding the layers together. Such a dielectric layer 125 can be formed by, for example, deposition, oxidation, spin-on, or another suitable process.

By the above configuration in the device 100, defects (characterized by non-uniform lines) designated by 160, can be limited to interfacial regions between substrate 120 and first layer 130 outside of the region defined by the spatial boundary of the trench. Thus, a freestanding region 150 is disposed on first layer 130 in an overlying relationship within the opposed sidewalls of trench 110. In the example of FIG. 1, the region 150 can be spaced apart from the trench sidewall boundaries, demonstrated by distance 180, such that the region is placed away from defects 160. In other examples, a portion of the freestanding region can extend beyond the trench sidewall boundaries, as a substantial portion of the active region remains within the trench sidewall boundaries, as shown in FIG. 2.

As shown in the example of FIG. 1, the area where substrate 120 and first layer 130 are in direct contact (e.g., the interfacial region) may form some dislocation defects 160. However, the freestanding region 150 overlaying the trench 110 will remain substantially defect-free. As additional layers may be provided, e.g., epitaxial growth providing active layer 140 to enable photonic devices, defects 160 may propagate upward into first layer 130 and through the junction where the substrate 120 and first layer 130 make contact. Certain types of electrical circuitry or a part of the circuitry (e.g., terminals, conductors, etc.) can be fabricated to operate without issue even with ingrowth of such defects. An active heterogeneous device can be integrated over the region 150 away from possible defects 160. Further, first layer 130 may be formed with a trench to enhance the trench 110 within substrate 120 or eliminate the need for the substrate 120 to contain a trench altogether.

Figure 2:
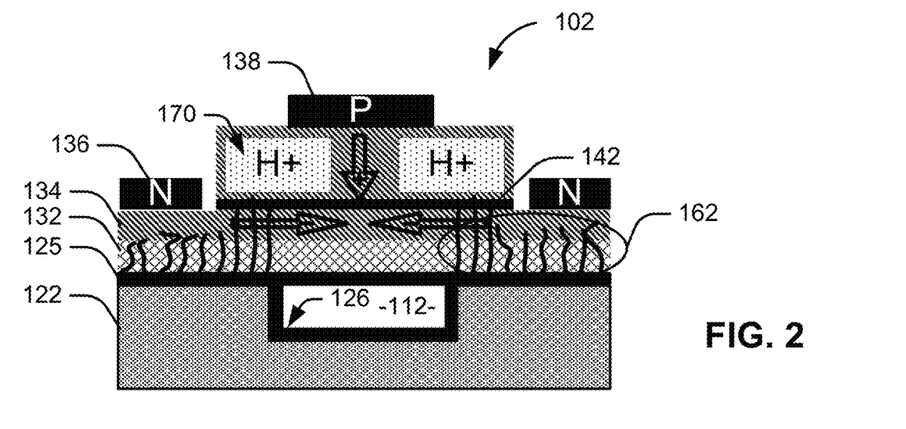
FIG. 2 illustrates another example of a hybrid multilayer device.

FIG. 2 illustrates another example hybrid multilayer device 102 (e.g., a laser) that can substantially eliminate defects associated with lattice and/or thermal mismatch in a layered device. In the example of FIG. 2, substrate 122 is provided with a trench 112 that can be formed in a manner similar to trench 110 described with respect to FIG. 1. A first layer 132 is disposed above the substrate 122, with dielectric layer 125 formed between the two. The dielectric layer 125 can be formed on the first layer 132 prior to bonding with the substrate 122. Additionally or alternatively, a dielectric layer 126 can be formed on the substrate 122. As one example, dielectric layer 125 is formed on the first layer 132, dielectric layer 126 is formed on the substrate 122, and the dielectric layers 125 and 126 are bonded together in a manner consistent with the techniques described herein. Additionally, one or more layers 134 can be disposed on the first layer 132. The layers 132 and 134 can be, for example, a III-V compound semiconductor. Defects characterized by non-uniform lines designated by 162, can be substantially limited to interfacial regions between substrate 122 and first layer 132 outside of the region defined by the spatial boundary of the trench.

In the example of FIG. 2, a III-V compound semiconductor mesa 142 can be formed with physical boundaries that extend beyond the trench sidewall boundaries, such that a central portion of the mesa 142 is located away from defects 162. In this example, a device that is incorporated with mesa 142 can benefit from a defect-free active region even though the physical width of the mesa 142 is larger than trench 112 below. The device is able to operate substantially free from defects in this arrangement by including a region 170, designated with an "H+", as a proton implanted region that is substantially electrically resistant (e.g., high impedance). As a result, injected carriers will not pass through region 170 but be forced to flow through a path of lower electrical resistance. The path followed by the injected carriers is depicted as a bold arrow with a "+" flowing from a p-junction 138 and directed toward an active layer 140.

In the example of FIG. 2, portions of region 170 are located above the interface of the substrate 122 and first layer 132. Thus, as portions of the region 170 are directly over the interface, dislocations 162 can potentially propagate into the mesa 142. However, the region 170 confines the flow of injected carriers to a central portion of the mesa 142, away from possible dislocations. Therefore, the injected carriers recombine with carriers from n-junctions 136 at a location toward the center of the mesa 142, as depicted by bold arrows with a "−". The injected carriers then emit photons in a concentrated region at the center of the mesa 142, mitigating possible interference from defects 162. In other words, provided that the flow of the injected carriers is directed to a portion of the region 170 that lies above the trench 112, device operation may not be adversely affected by possible dislocations 162. Accordingly, a hybrid multilayer device may have an area with lateral dimensions within the sidewall boundary of the trench below, as illustrated in FIG. 1, can have lateral dimensions similar to the trench below, or can have lateral dimensions that extend beyond the sidewall boundary of the trench below, as illustrated in FIG. 2.

Figure 3:
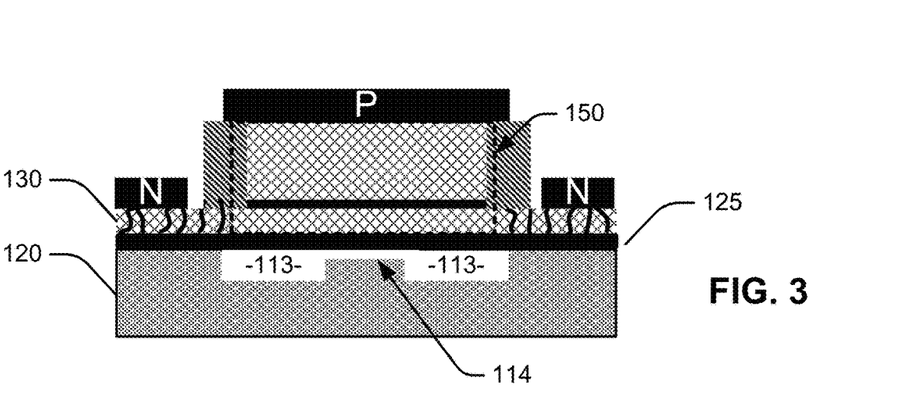
FIG. 3 illustrates yet another example of a hybrid multilayer device.

FIG. 3 shows a multilayer device formed in a manner similar to FIGS. 1 and 2. In FIG. 3, however, the trench is defined by two channels 113. The channels 113 are divided by a raised portion that serves to waveguiding optical mode. The raised portion extends from the substrate 122 towards the dielectric layer 125, but falls short of making contact with dielectric layer 125. Thus, an air gap 114 is maintained between the dielectric layer 125 and the raised portion, thereby preserving the benefits of the trench 112 (in the example of FIG. 2) while mitigating the effects from, for example, outgassing as described herein.

In view of the foregoing structural and functional features described above, example methods of making a hybrid multilayer device (e.g., the device 100 of FIG. 1) will be better appreciated with reference to FIGS. 4-10. In the examples of FIGS. 4-10, various types of process parameters can be utilized at various steps according to application requirements and the structures being fabricated and materials used in such fabrication. While, for purposes of simplicity of explanation, the methods of FIGS. 4-10 are shown and described as executing serially, the methods are not limited by the illustrated order, as some actions could in other examples occur in different orders and/or concurrently from that shown and described herein.

The method described in FIGS. 4-10 can combine a wafer bonding process with heteroepitaxy to result in a hybrid multilayer device with a free-standing region above the substrate that is and remains substantially defect free. Compared to heteroepitaxy, the wafer bonding process does not require a substantial lattice match between two layers. Further, wafer bonding can be a less complex and costly process than traditional heteroepitaxy. In the described example method of FIGS. 4-10, although defects due to lattice match are substantially eliminated, modest thermal expansion cannot be ignored as strong wafer bonding may require elevated temperatures to properly anneal the bonding agent for attaching the respective layers. Thus, in this example, the wafer bonding process is combined with a trench upon which the active region rests in order to avoid thermal defects at the bonding interface. In this example, two or more layers (e.g., corresponding to at least a portion of the resulting active region) are formed together before bonding to the substrate. Moreover, a dielectric layer is formed between layers to be bonded, resulting in encapsulated layers that are protected from extreme environments of the fabrication process.

Figure 4:
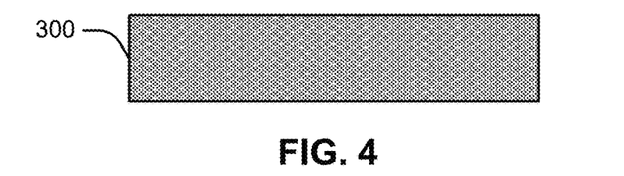
FIGS. 4 to 10 illustrate an example method that can be employed to manufacture a hybrid multilayer device.
Figure 5:
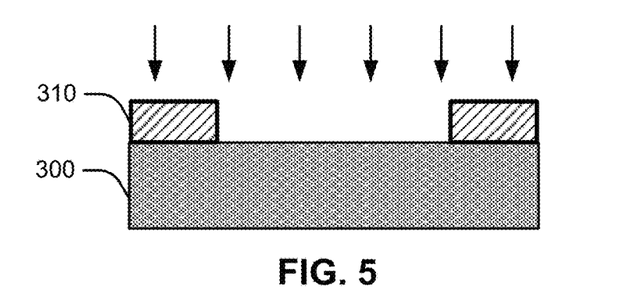
Figure 7:
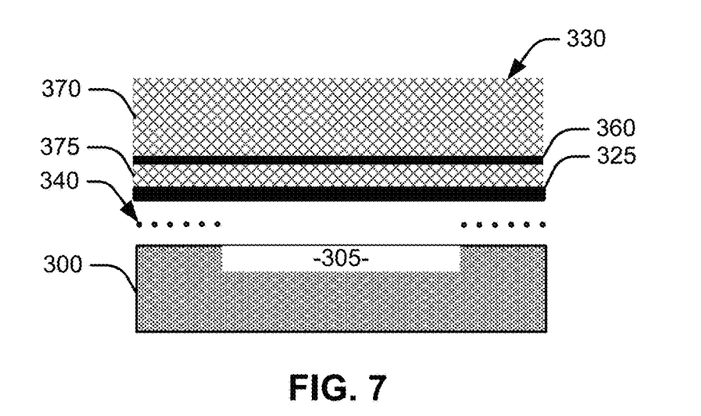

FIG. 4 provides a substrate 300, e.g., corresponding to the substrate 120 of FIG. 1. FIG. 5 illustrates the substrate 300 subject to an etching process in order to create at least a portion of a trench. For example, a photoresist 310 or other masking material can be used to define the dimensions of a trench 305, as shown in FIG. 7. The photoresist 310 may be formed over the substrate 300 via conventional spin-coating or spin casting deposition techniques. That is, the patterned photoresist 310 can serve as an etch mask layer for processing or etching the underlying silicon substrate 300. For example, the trench can be formed via etching, such as a reactive ion etching (RIE). For example, a silicon substrate can be anisotropically etched with one or more plasma gases, such as carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of a patterned photoresist layer. The trench 305 can be dimensioned and configured to have a width that is greater than a depth of the device. In some examples, the trench can extend completely through the substrate layer include a plurality of elongate sections formed in the substrate 300 via one or more similar etching processes.

Figure 6:
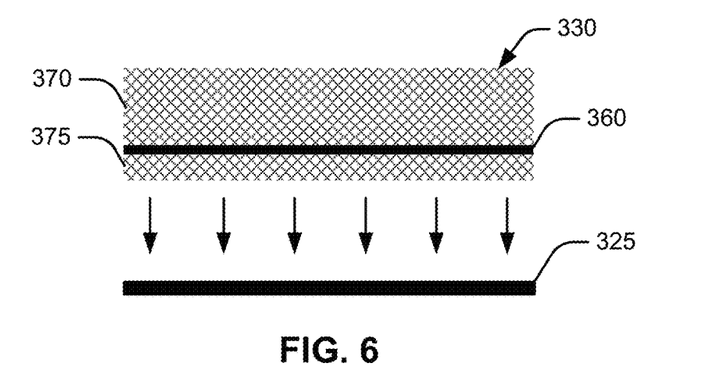

FIG. 6 illustrates forming a material structure 330 to be bonded to the substrate, as described herein. As shown in FIG. 7, the multilayer structure 330 can be bonded to the substrate 300 by a bonding agent 340. The multilayer structure 330 can include an active region 360 and one or more layers 370, 375, for example. Additionally, a dielectric layer 325 can be bonded to the multilayer structure 330. The dielectric layer 325 can be formed from a single layer of dielectric material or a combination of multiple layers. A surface of the dielectric layer 325 opposite the multilayer structure 330 is also bonded to the substrate 300. Thus, in the example of FIG. 6, the dielectric layer 325 covers a surface of the multilayer structure 330 at the interfacial region between the multilayer structure 330 and the substrate 300.

Figure 8:
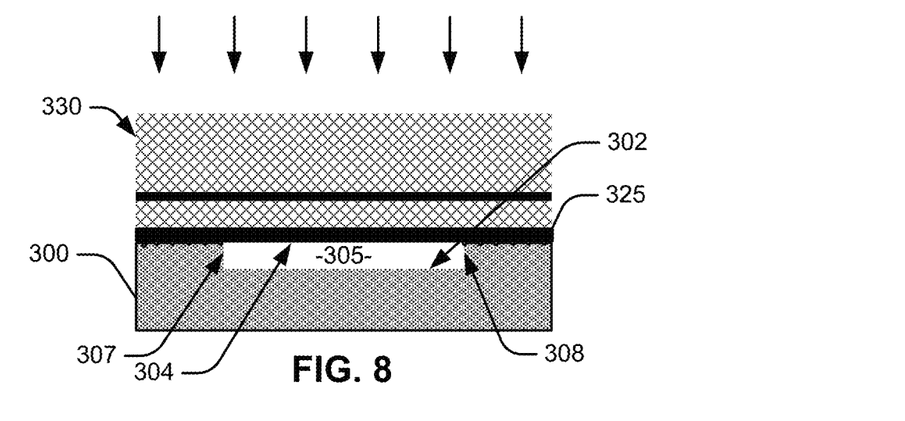

Thus, as shown in FIG. 7, the multilayer structure 330 with the dielectric layer 325 can be bonded to the substrate 300 by a bonding agent 340, resulting in the layered structure shown in FIG. 8. The wafer-bonding step can include hydrophobic, hydrophilic, polymer, metal bonding, or the like. Additionally or alternatively, such a polishing step can be employed to refine bondable dielectric surfaces to ensure a strong bond between layers. The polishing step can smooth over the surface and/or surfaces to be bonded allowing this defect-free heterogeneous platform to be realized on materials that may have a rough or bowed surface by one or more processing step. As an example, some materials used in device manufacturing (e.g., GaN) may exhibit surface defects when exposed to heat or other processing agents. Polishing such a surface in preparation for the bonding process ensures the bond between the substrate and the multilayer structure is strong.

In some examples the trench 305 can be wholly formed in the substrate. As illustrated in FIG. 8, the trench 305 can be defined by sidewalls 307 and 308 that extend from a surface 302 within the substrate 300 and terminate in an adjacent surface 304 of the layer 330. In other examples, the trench 305 can be partially formed in the layer 330 and partially formed in the substrate 300 such that the sidewalls of the trench are aligned as the layers 300 and 330 are bonded together as to form continuous sidewalls for the trench. In yet another example, the trench 305 can be formed wholly within the multilayer structure 330, bounded by the adjacent surface of the substrate 300 (e.g., the surface to which the layer 330 is bonded). Although demonstrated as substantially parallel, the sidewalls 307 and 308 may be at an angle relative to each other. Thus, one or both of the sidewalls 306 and 208 may be perpendicular to the surface 302 of the substrate and the surface 304 of the dielectric 325, as demonstrated, or each of the sidewalls 307 and 308 may be at another angle. Moreover, each of the sidewalls 307 and 308 may have the same or different angle relative to the surface 302 of the substrate 300 and the surface 304 of the dielectric 325 or may have different angles and/or orientation. The trench 305 can be etched to have a smooth or textured surface and may include planar surfaces or the surfaces, in other examples, could be curved.

Figure 9:
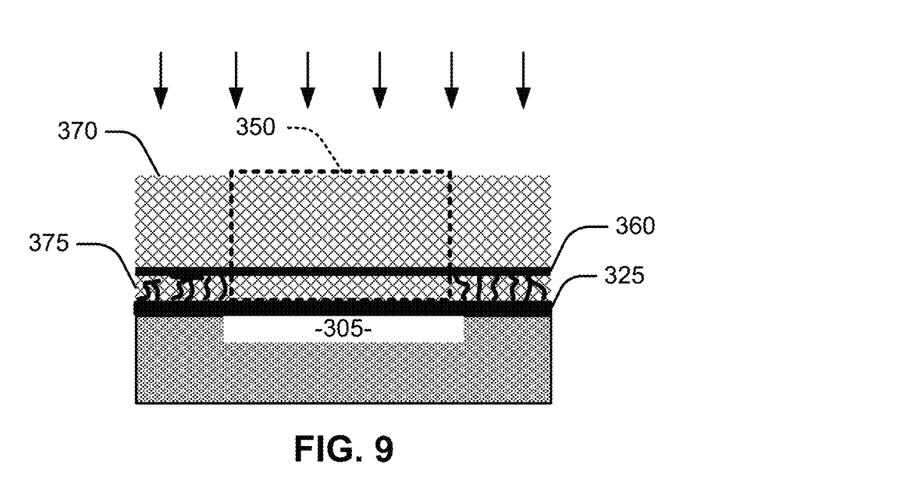

The resulting structure, shown in FIG. 9, can then be processed by epitaxial growth and/or other fabrication techniques (e.g., heteroepitaxy, homoepitaxy or the like). Additional layers can be grown (or otherwise fabricated) upon the multilayer structure 330, such as followed by one or more active layer 360, and one or more subsequent layers 370. The resulting structure provides for an active device structure in a freestanding region 350, designated by a dotted line, in overlying relationship with the trench. For instance, the active device structure in the region 350 can reside within lateral boundaries defined by sidewalls of the trench 305. The freestanding region 350 is therefore spatially spaced apart from the interfacial region between the substrate 300 and first layer 330, as well as any constituent defects that might occur in the interfacial region. Regrowth of the layered material is conducted to passivate the etched interface to make high-performance photonic components and integrated circuits.

Epitaxial growth or the like can be employed to fabricate additional layers of one or more active structures that are built upon multilayer structure 330. Fabrication can, for example, be performed by applying appropriate deposition and/or etching techniques to a stack of materials (e.g., III-V semiconductor compound materials), although the examples described are not limited to these techniques. For example, fabrication can include epitaxially growing a stack of materials (e.g., III-V semiconductor compound materials). Epitaxial growth is a technique that can be used to fabricate various electronic and optical devices. Such devices can have a complicated structure, which may be formed from a number of thin layers with various compositions. Fabrication can, for example, include utilizing electron-beam lithography to define predetermined variations in the structure. In fabricating the hybrid multilayer device, the layered material may have lattice and thermal characteristics that approach the characteristics of a device active region. In other words, the multilayer structure 330 can provide a template for additional heteroepitaxial growth for one or more specific devices (e.g., photodetector, laser, modulator, amplifier, photonic integrated circuits, etc.). Fabrication can, in various examples, include the stack of materials being processed to form a compact monolithic photonics platform by forming subsequent layers on the first layer (e.g., via epitaxial growth, among other appropriate techniques for forming a monolithic, integrated structure)

Figure 10:
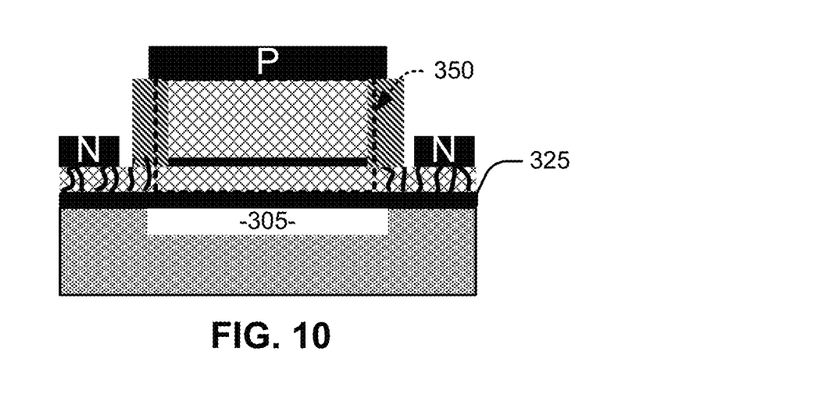

Additional epitaxial growth and/or lithographic techniques can be applied to result in a hybrid multilayer device, which can include one or more p-n junctions, such as shown in FIG. 10. Additionally, to provide for structural support, in some examples, one or more spaced apart support structures (not shown) can be constructed below the device (e.g., extending in the trench between upper and lower surfaces) to balance the mechanical forces (e.g., stress and strain) in the sealed trench chamber and outside environment. Thus, the completed hybrid multilayer device, as shown in FIG. 10, includes a substantially defect free freestanding region 350 above the trench 305, such as disclosed herein.

In addition to encapsulating the exposed area to avoid outgassing or undesirable material growth, the added dielectric layer can provide specific advantages. A single dielectric layer or a combination of dielectric layers stack can be engineered to minimize or even eliminate the strain between the substrate and template during bonding or following re-growth of additional material layers on the template. It can reduce the defect formation at the region where multilayer structure contacts with the substrate. For example, the wafer bonding process described herein results in a mature, strong and covalent dielectric-to-dielectric bonded structure. In other words, no bonding process development is needed when different materials are selected, thus ensuring ease of integration with other materials and systems. Moreover, in addition to providing protection from the aforementioned outgassing phenomenon, the dielectric layer can protect the substrate and template from various other damage that may result from the device fabrication process. As a non-limiting example, acid or other fluids can be used during fabrication that may cause damage to an exposed surface of one or more materials.

Figure 11:
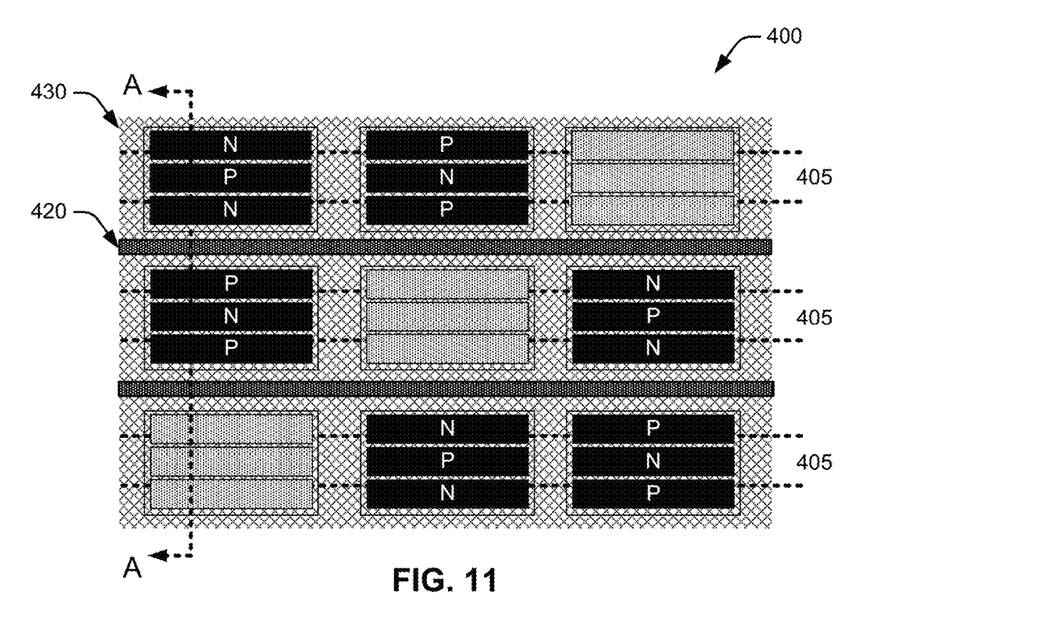
FIG. 11 illustrates an example platform including a hybrid multilayer device.

By way of further example, FIG. 11 provides a plan view of a platform 400 that includes a plurality of hybrid multi-layer devices that have been formed in a manner consistent with the processes described herein. The platform of FIG. 11 demonstrates a single substrate 420 with three trenches 405 extending horizontally and designated by paired dotted lines. A first layer 430 is provided above each trench for additional processing. In the example of FIG. 11, a first layer above each trench is separated from each other first layer. On top of the first layer, one or more devices can be formed. FIG. 11 shows three distinct trenches 405, with three distinct first layers, and three hybrid multilayer devices formed on each first layer above the trenches 405.

Figure 12:
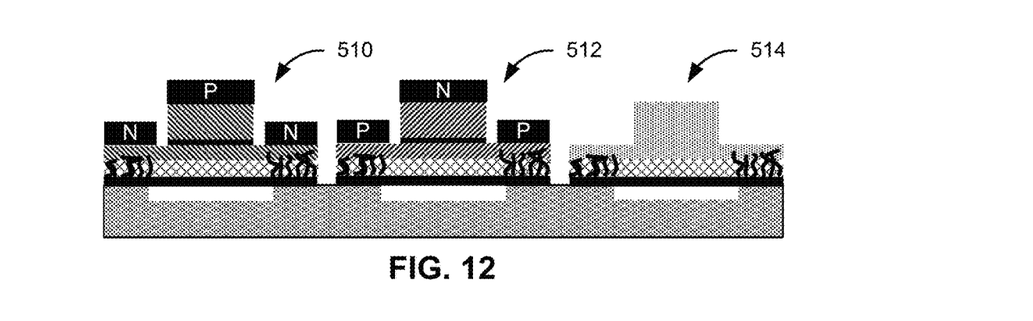
FIG. 12 illustrates a cross sectional view of the example platform of FIG. 11.

FIG. 12 provides a cross sectional view of the platform of FIG. 11, taken along line A-A of FIG. 11. The cross-sectional view of FIG. 12 illustrates three hybrid multilayer devices 510, 512, and 514, each of which is formed in accordance with the examples provided herein. The devices may be the same or a combination of different devices. As one example of FIG. 12, device 510 represents a laser, device 512 represents a photodetector, and device 514 represents a passive waveguide. However, depending on the required application, devices 510, 512, and 514 can be, for example, a laser, a photodetector, a modulator, or any other device or combination of devices. Although, the devices and process described herein are ideal for photonic applications, such as in-plane diode lasers, this process provides an attractive technique for a variety of heterogeneous devices, such as electronic, micro electrical mechanical systems (MEMS), etc.

Figure 13:
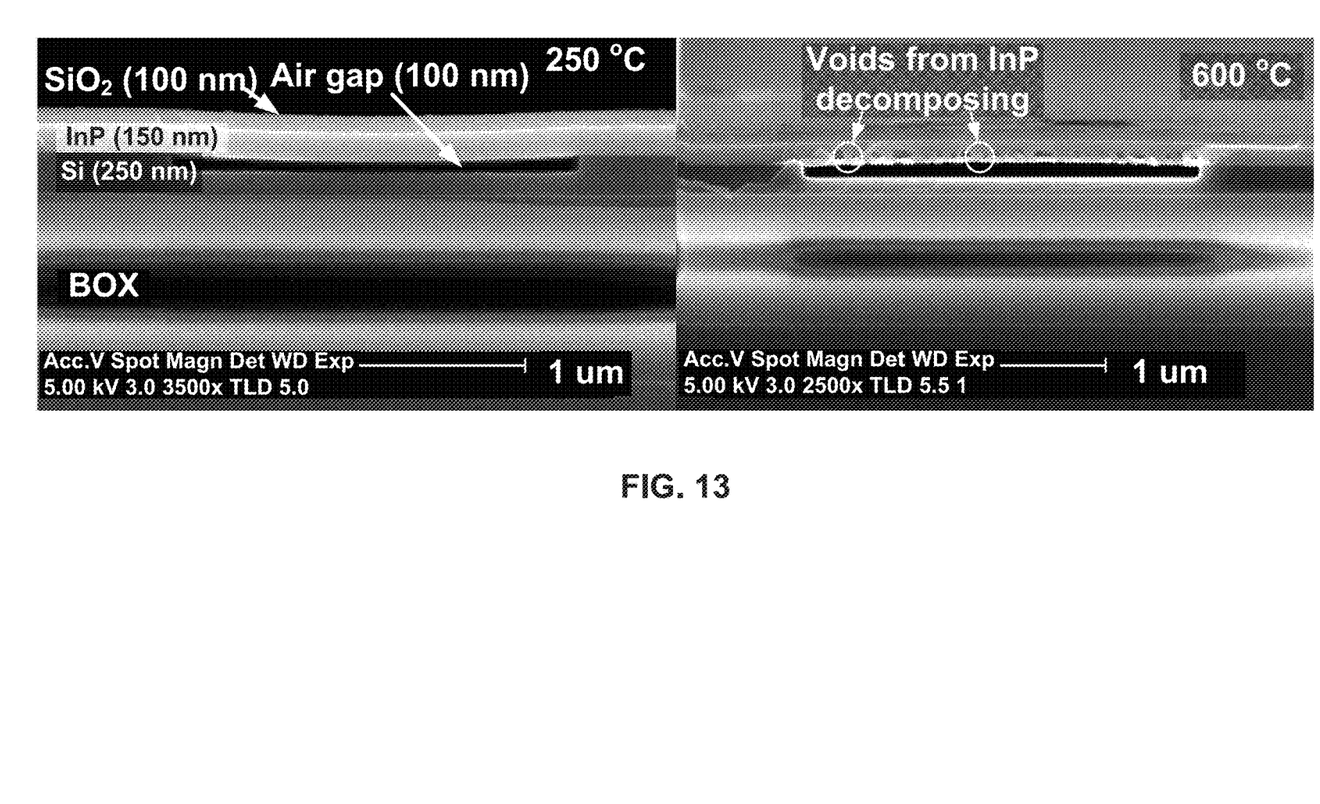
FIG. 13 illustrates an example SEM cross-sectional image of an example hybrid multilayer device.

FIG. 13 illustrates a scanning electron microscope (SEM) cross-sectional images of thin InP template bonded on a SOI substrate after (a) 250 degrees Celsius and (b) 600 degrees Celsius thermal processes. As shown in FIG. 13, a SEM or other optical and/or electrical measurement methods can image the resulting structure and identify the unique layers therein. FIG. 13 shows SEM cross-sectional images of such a heterogeneous substrate with a thin material layer of Indium phosphide (InP) bonded on a silicon on insulator (SOI) substrate with a 3 μm-wide, 100 nm-deep air trench. The freestanding InP area above the trench can serve as the template to allow defect-free heteroepitaxy. As shown in FIG. 13, no defects (e.g., cracks or other voids) are created after deposition of the layer of 100 nm thick $SiO_2$ through Plasma-enhanced chemical vapor deposition (PECVD). However, during deposition of additional layers, temperatures increased (e.g., up to 600 degrees Celsius) and defects can be seen on the thin material layer above the trench. In other words, the InP material decomposed at the higher temperatures, as the In and P atoms diffused out through the air trench, in an outgassing process. Exposed portions may form defects in a similar fashion if there is heated gas flow in the trench. If there is enough gas flow, it is also possible to grow material on the exposed InP and Si surface in the air trench, which can potentially jam or damage the freestanding template. However, as shown the top $SiO_2$ layer acts as a capping layer preventing the InP outgassing from the surface.

By the processes and hybrid devices described herein, which employs a trench formed below corresponding active regions and a dielectric separating bonded layers, substantially defect-free heterogeneous devices and integration is possible. The methods described herein thus enable consistent and high quality semiconductor processing. In comparison to other attempts to create a defect-free hybrid device, wafer bonding of Si substrates with III-V compound semiconductors is relatively low-cost. The addition of the intermediate dielectric layer makes possible the benefits of the hybrid design while mitigating the potential damage from the processing steps. Further, these methods and resulting structures can be used in the fabrication of a wide range of heterogeneous devices.

Furthermore, relative terms used to describe the structural features of the figures illustrated herein, such as above and below, up and down, first and second, near and far, etc., are in no way limiting to conceivable implementations. For instance, where examples of the structure described herein are described in terms consistent with the figures being described, and actual structures can be viewed from a different perspective, such that above and below may be inverted, e.g., below and above, or placed on a side, e.g., left and right, etc. Such alternatives are fully embraced and explained by the figures and description provided herein.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A device, comprising:
    a substrate having a trench extending between a first end and a second end of the trench along a first surface of the substrate;
    a first semiconductor layer disposed on the first surface of the substrate and extending between the first end and the second end of the trench, the first semiconductor layer comprising a given surface and another surface;
    a dielectric layer between the given surface of the first semiconductor layer and the first surface of the substrate, wherein at least one sidewall at the first and second ends of the trench is substantially perpendicular to the dielectric layer that is covering the trench; and
    an active region disposed on the other surface of the first semiconductor layer overlying the trench, wherein at least a portion of the active region resides substantially above a region defined by the trench.

2. The device of claim 1, wherein another dielectric layer is formed on the first surface of the substrate.

3. The device of claim 1, wherein the dielectric layer comprises one of $SiO_2$, $Si_3N_4$, $Al_2O_3$.

4. The device of claim 1, wherein the substrate comprises a raised portion extending from a bottom surface of the trench toward the dielectric layer dividing the trench into two channels.

5. The device of claim 4, wherein the raised portion is separated from the dielectric layer by an air gap.

6. The device of claim 1, wherein the dielectric layer comprises a plurality of layers.

7. The device of claim 1, wherein a portion of the trench is contained in the substrate and another portion of the trench is contained in the dielectric layer.

8. The device of claim 1, wherein a width of the trench is defined by sidewalls extending from a surface within the substrate and terminate in an adjacent surface of the dielectric layer, such that the trench resides completely within the substrate bounded by the adjacent surface of the dielectric layer.

9. The device of claim 1, wherein both sidewalls at the first and second ends of the trench are substantially perpendicular to the dielectric layer that is covering the trench.

10. A circuit, comprising:
a plurality of multilayer devices formed on a substrate, the substrate having a trench extending along a first surface of the substrate, each device of the plurality of multilayer devices comprising:
a first layer disposed on the first surface of the substrate, the first layer comprising a given surface and another surface;
a dielectric layer between the given surface of the first layer and the first surface of the substrate, wherein the trench comprises a raised portion extending from a bottom of the trench toward the dielectric layer, dividing the trench into two sections; and
an active region disposed on the other surface of the first layer overlying the trench, wherein at least a portion of the active region resides substantially above a region defined by the trench.

11. The circuit of claim 10, wherein each multilayer device of the plurality of multilayer devices is bonded to the substrate by one of a hydrophobic bond, a hydrophilic bond, a polymer bond or a metal bond.

12. The circuit of claim 10, wherein the active region of each of the plurality of multilayer devices resides substantially within boundaries defined by sidewalls of the trench.

13. The circuit of claim 10, wherein each multilayer device of the plurality of multilayer devices comprises one of a laser, a photodetector, a modulator, and a passive waveguide.

14. The device of claim 10, wherein the trench is extending between a first end and a second end of the trench, and wherein at least one sidewall at the first and second ends of the trench is substantially perpendicular to the substrate.

15. The device of claim 10, wherein the trench is extending between a first end and a second end of the trench, and wherein at least one sidewall at the first and second ends of the trench is substantially perpendicular to the dielectric layer covering the trench.

16. The device of claim 10, wherein the first layer is a semiconductor layer.

17. A method of fabricating a multilayer device, comprising:
etching a substrate to form a straight trench extending between a first end and a second end of the trench along a first surface of the substrate;
bonding a structure to the substrate with a dielectric layer being formed between the structure and the substrate, wherein at least one sidewall at the first and second ends of the trench is substantially perpendicular to the dielectric layer that is covering the trench; and
forming an optically active region on the structure located in an overlying relationship with the trench such that at least a portion of the optically active region resides substantially above a region defined by the trench.

18. The method of claim 17, further comprising polishing a surface of one of the substrate and the structure prior to bonding.

19. The method of claim 17, wherein the dielectric layer is formed on at least one of the substrate and the structure.

20. The method of claim 17, wherein the multilayer device is one of a laser, a photodetector, a modulator, and a passive waveguide.

* * * * *